(12) United States Patent
Mann

(10) Patent No.: US 8,141,840 B2
(45) Date of Patent: Mar. 27, 2012

(54) COMPACT SUPPORT SYSTEM USING LOW ASPECT RATIO COMPOSITE TENSILE SUPPORT BANDS

(75) Inventor: Nicholas Mann, Compton (GB)

(73) Assignee: Siemens PIC, Frimley, Camberley (GB)

( * ) Notice: Subject to any disclaimer, the term of this patent is extended or adjusted under 35 U.S.C. 154(b) by 1300 days.

(21) Appl. No.: 11/441,130

(22) Filed: May 26, 2006

(65) Prior Publication Data
US 2007/0087845 A1 Apr. 19, 2007

(30) Foreign Application Priority Data
May 26, 2005 (GB) .................................. 0510715.6

(51) Int. Cl.
*F16M 13/00* (2006.01)
*F16D 3/50* (2006.01)
(52) U.S. Cl. .......... 248/620; 248/634; 248/317; 464/55; 74/579 R
(58) Field of Classification Search .................. 248/317, 248/323, 324, 589, 610, 620, 621, 634, 596; 62/51.1, 297; 464/55, 903; 74/579 R, 581
See application file for complete search history.

(56) References Cited

U.S. PATENT DOCUMENTS

| | | | | |
|---|---|---|---|---|
| 3,279,278 A | | 10/1966 | Eldred | |
| 3,421,742 A | * | 1/1969 | Swanke et al. | 241/282.2 |
| 3,768,334 A | * | 10/1973 | Ditlinger | 74/579 R |
| 4,325,530 A | * | 4/1982 | Niemann et al. | 248/317 |
| 5,280,309 A | * | 1/1994 | Zinsmeyer et al. | 346/139 R |
| 6,230,502 B1 | * | 5/2001 | Kershaw | 62/51.1 |
| 6,485,207 B1 | * | 11/2002 | Allen et al. | 400/335 |
| 7,665,313 B2 | * | 2/2010 | Dixey et al. | 62/51.1 |

FOREIGN PATENT DOCUMENTS
GB 2 348 693 A 10/2000

OTHER PUBLICATIONS

Great Britain Search Report dated Aug. 31, 2005 (One (1) page).
R. Kevin Giesy, "Composite Support Structures for Cryogenic Systems", Structural Composites Industries (SCI), Cryogenic Engineering Conference/International Cryogenic Materials Conference, Jul. 17-21, 1995, Columbus, Ohio, USA.
R. P. Reed, et al. "Cryogenic composite supports: a review of strap and strut properties", Cryogenic Materials, Inc., Cryogenics, 1997, pp. 233-250, vol. 37, No. 5.

\* cited by examiner

*Primary Examiner* — Tan Le
(74) *Attorney, Agent, or Firm* — Crowell & Moring LLP

(57) ABSTRACT

A support system comprising a number of racetrack-shaped tensile support bands (22) held in tension between a supported article and a supporting article, respective curved end portions of each tensile support band being retained by respective mounting points (30) mounted on respective surfaces of the supported article and the supporting article, respectively. At least one of the tensile support bands is arranged so that the curved end portions lie in a plane substantially parallel to the surface upon which the respective mounting point is mounted; and at least one mounting point is a monolithic mounting point having a curved surface (32) which is complementary to an inner curved surface of an end of the tensile support band.

11 Claims, 4 Drawing Sheets

PRIOR ART

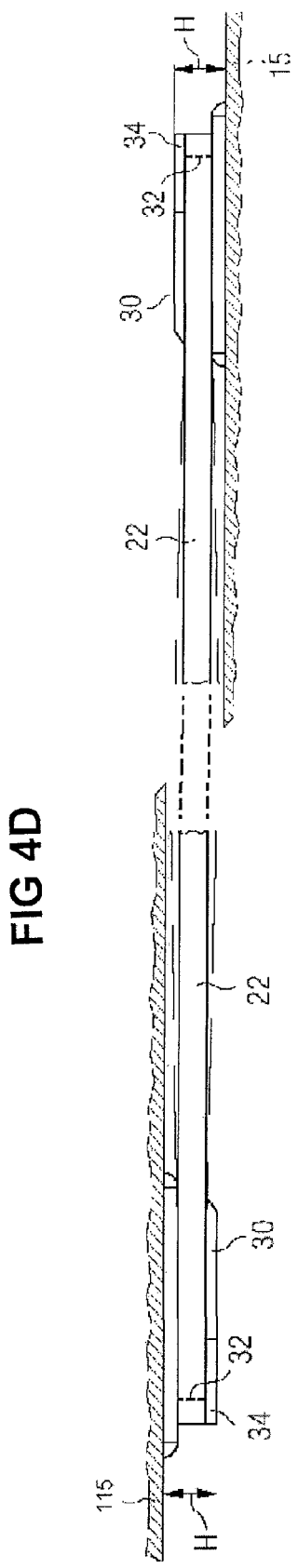

COMPACT SUPPORT SYSTEM USING LOW ASPECT RATIO COMPOSITE TENSILE SUPPORT BANDS

BACKGROUND AND SUMMARY OF THE INVENTION

The present invention relates to support structures comprising tensile support bands, particularly such structures for retaining concentric vessels, and more particularly such structures with low thermal conductivity for supporting closely spaced concentric vessels in cryogenic applications.

In systems such as cryostats for holding superconducting magnets for magnetic resonance imaging (MRI) or nuclear magnetic resonance (NMR), or for space-borne dewars, it is necessary to firmly mechanically support concentric hollow vessels, in such a way that the support structure conducts very little heat. Conventional arrangements include the use of fibre reinforced racetrack-shaped tensile support bands. The term 'racetrack-shaped' is understood in the art to refer to a loop shape comprising two parallel sides joined by semicircular end portions. Such tensile support bands are held by mounting points on the outer and inner vessels. The tensile support bands are put under tension and the inner vessel is thereby supported within the outer vessel, but not in contact with it other than through the tensile support bands. By making the tensile support bands of fibre-reinforced composite materials, they may be made to have a very high tensile strength, and a very low thermal conductivity. Tensile support bands made from composite materials containing fibres such as glass or carbon offer unique strength, stiffness, and thermal properties compared with other materials. However, the mounting points that allow the tensile support band to be connected to the vessels are bulky and complicated relative to the tensile support band itself. The result is that the potential space saving advantages of the high strength composite cannot be fully exploited in many applications, since the minimum separation between concentric vessels becomes defined by the need to accommodate the mounting points for tensile support between the concentric vessels.

The high strength and stiffness, and advantageous thermal properties of glass, carbon or other fibre reinforced plastics are widely utilised for load bearing tensile support bands. Such tensile support bands are typically manufactured using a filament winding process to achieve the best strength of the fibres, commonly in the form of racetrack shaped tensile support bands. In order to achieve the highest tensile strength, the geometry of the tensile support bands at the loop ends must be maintained within certain parameters, in particular the diameter to thickness ratio (D/t) must be kept high (typically >10), leading to a cross section of high aspect ratio (W/t) (typically width to thickness ratio >10). Such tensile support bands are sensitive to bending loads, which result in severely reduced tensile strength. In practical applications, where misalignment and movements of the supported structures occur, the ends of the tensile support bands must be supported using a suitable, typically spherical, bearing arrangement.

Examples of arrangements using tensile composite tensile support bands are described by R. Kevin Giesy in *Cryogenic Engineering Conference/International Cryogenic Materials Conference* July 17-21, 1995, Columbus Ohio and by R. P. Reed and M. Golda in *Cryogenics* 37 (1997) pages. 233-250.

FIGS. 1A and 1B illustrate a conventional mounting point 10 for a tensile support band. The minimum height H of the mounting point is largely determined by the need to provide a bearing arrangement. A support pin 12 is carried by a generally U-shaped support 14, shown cut away in FIG. 1A. The support 14 is itself rigidly mechanically attached, for example by welding, to one of the vessels 15 between which the tensile support band 20 is to be installed. A bearing 16 of generally spherical shape is provided on the support pin 12. A support roller 18 is provided, having an inner surface complementary to the bearing 16, and an outer surface of cylindrical form. The tensile support band 20 itself is placed over, and in contact with, the cylindrical outer surface of the support roller 18. The support roller is free to move, within a limited range, by rotation about the bearing 16. This allows effective retention of the tensile support band 20 even in the case of misalignments and movement, avoiding placing uneven loading on the tensile support band, which might otherwise occur if such a mounting point were not provided.

The height H of the mounting point could possibly be reduced by reducing the loop diameter D of the tensile support band. However, in order to preserve the ratio D/t>10, the thickness t of the tensile support band would have to be reduced by the same proportion. This, in turn, would require an increase in the width W of the tensile support band to maintain the required tensile support band strength. The reduced diameter D and increased width W would cause the tensile support band to be even more susceptible to damage by bending loads due to misalignment or movement. Changing the orientation of the tensile support band so that the pin 12 were mounted perpendicular to the surface of the vessel 15 would typically not reduce the height H since the width W of the tensile support band is typically greater than its diameter D.

FIG. 2 illustrates a typical conventional tensile support band 20. The diameter D is reduced as far as possible, to allow the height H of the mounting point 10 to be minimized. In order to maintain the preferred ratio D/t>10, the thickness t is also minimized. In order to maintain a required tensile strength despite such reduced thickness, the width W is increased.

The combination of high aspect ratio W/t cross-section and the need to accommodate a bearing 16 results in a relatively large and complex system in which the size of the tensile support band mounting points 10 exceed the rest of the tensile support band 20. In many applications the space available for installation of tensile support bands and their associated mounting points is limited, and minimizing the space required is an important design requirement, which is thus compromised. This is particularly applicable to the suspension of close-fitting concentric vessels such as are used in super-conducting magnet cryostats. In addition, the cost of the bearing assembly of mounting point 10 is relatively high.

The present invention provides an arrangement which aims to alleviate at least some of the drawbacks of the prior art. The present invention accordingly provides methods and/or apparatus as defined in the appended claims.

BRIEF DESCRIPTION OF THE DRAWINGS

The above, and further, objects, advantages and characteristics of the present invention will become more apparent by reference to the following description of certain embodiments thereof, in conjunction with the accompanying drawings, wherein:

FIGS. 4A to 4D illustrate a mounting point, according to an aspect of the present invention, for a tensile support band according to the present invention.

DETAILED DESCRIPTION OF EXEMPLARY EMBODIMENTS

The present invention provides a novel form of tensile support band, and of a mounting point for a tensile support band, which has a very low profile, is cheap to produce and is simple to install.

Figure 2:
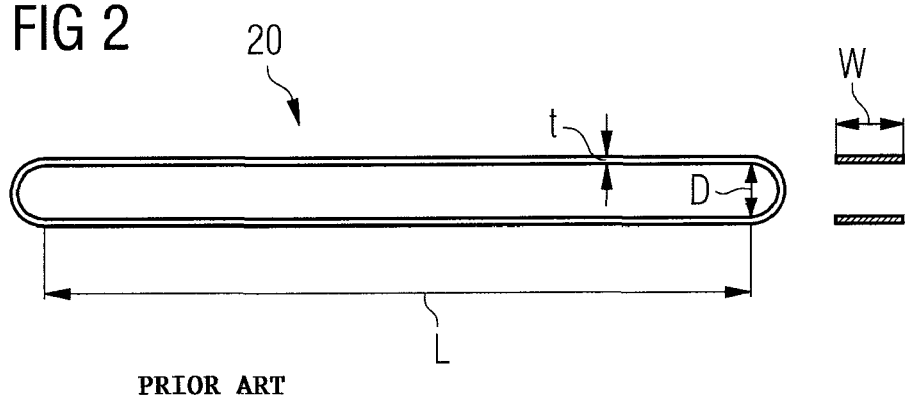
FIG. 2 illustrates a tensile support band according to the prior art.
Figure 3:
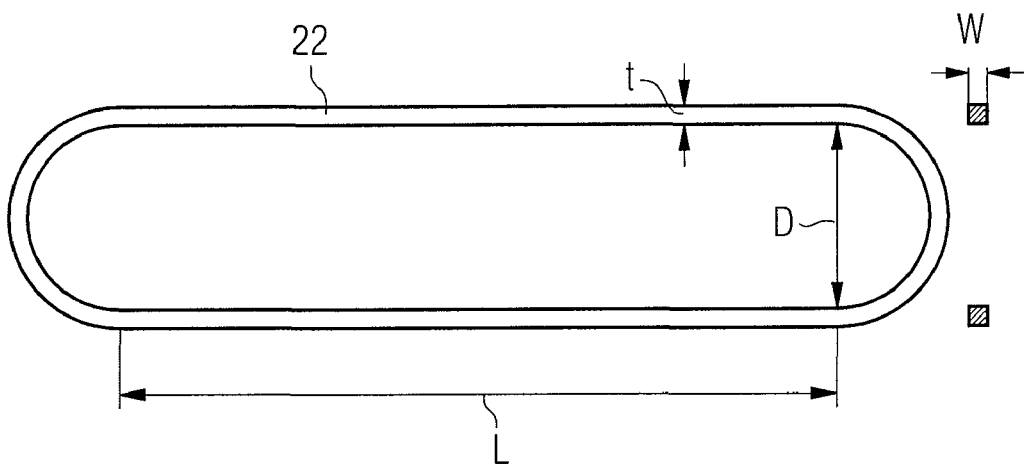
FIG. 3 illustrates a tensile support band according to an embodiment of the present invention.

FIG. 3 illustrates a tensile support band 22 according to an aspect of the present invention. Contrary to conventional thinking, the tensile support band of the present invention maintains the diameter to thickness ratio D/t>10, but significantly reduces the width W of the tensile support band while maintaining tensile support band strength and cross-sectional area by increasing the thickness t. For the purposes of comparison, it is assumed that the tensile support band of the invention illustrated in FIG. 3 is formed of the same material as that of the conventional tensile support band of FIG. 2. The tensile support band of the invention may be formed of any material conventional for such applications, such as a resin reinforced by fibres such as carbon fibre, glass fibre, Kevlar fibres or alumina fibres.

In the illustrated embodiment, the aspect ratio of width W to thickness t is approximately 1.0. In the tensile support band 22 of the present invention, the dimensions are changed to a much lower aspect ratio than normal, such that the width W is reduced to approximately equal the thickness t, which thickness is itself increased to maintain a required tensile strength. In order to preserve strength the loop diameter is in turn increased to maintain the D/t ratio in the favourable region (>10). Although this diameter D is the larger than for a conventional tensile support band, the present invention provides a novel mounting point and method for installing tensile support bands, which allow installation in a small gap, for example between concentric vessels. By virtue of its geometry, the low aspect ratio tensile support band of the invention (FIG. 3) is inherently less sensitive to bending loads than the conventional high-aspect ratio tensile support band (FIG. 2).

According to an aspect of the present invention, the bearing-based mounting point arrangement 10 of the prior art (FIGS. 1A, 1B) may be replaced with a simple fixed mounting point in the form of a hook. The resultant tensile support band and mounting point arrangement is both compact and simple, and readily adaptable to economic installation in confined spaces between, for example, concentric vessels.

Figure 4A:
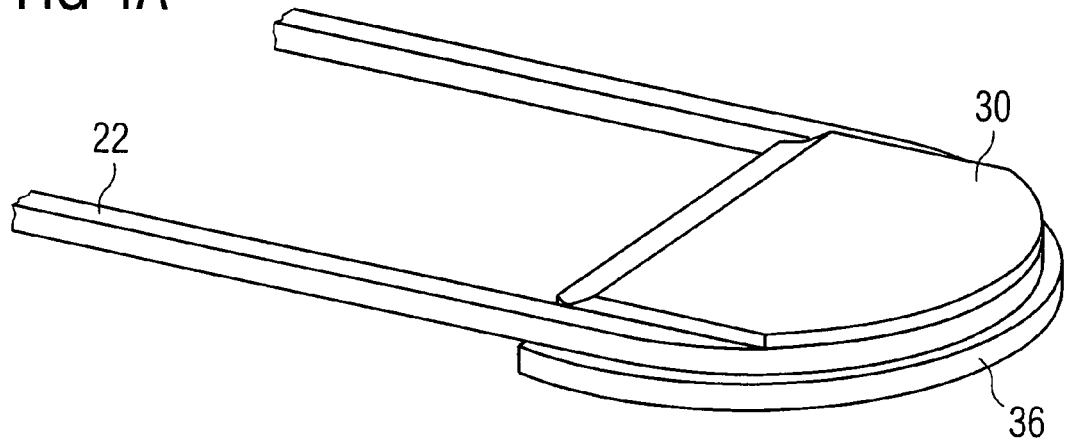
Figure 4B:
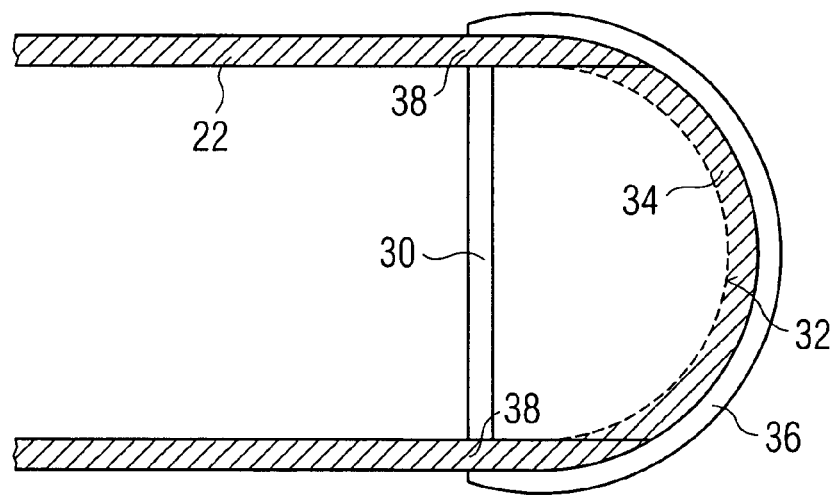
Figure 4C:
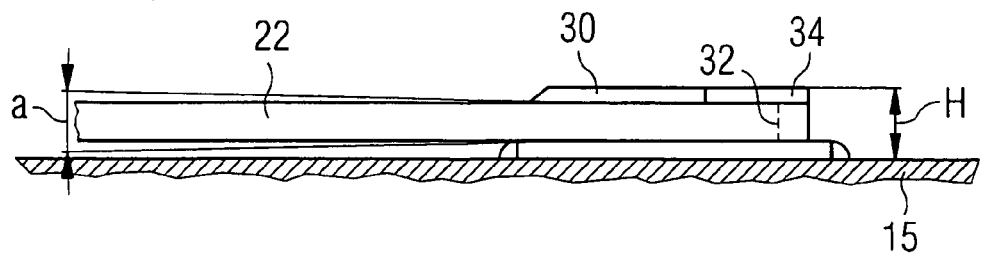

FIGS. 4A-4C show a mounting point 30 according to an aspect of the present invention. The mounting point 30 is a monolithic mounting point having a curved surface 32 which is complementary to an inner curved surface of an end of the tensile support band 22. Preferably, it is in the form of a simple hook having an overhanging retaining portion 34, provided to retain the tensile support band 22 and to prevent it from slipping off of the curved surface 32. A protruding lower lip 36 is preferably also provided. This may assist in retaining the tensile support band 22 in its intended position, and also prevents the tensile support band 22 from coming into direct contact with the vessel 15. FIG. 4D shows an exemplary embodiment in which a tensile support band 22 is held in tension between a vessel 15 that is a supporting article and a vessel 115 that is a supported article.

The mounting point 30 is preferably attached directly to one of the vessels 15 between which the tensile support band is to be installed, for example by welding or bolting. Unlike the arrangement of the prior art shown in FIGS. 1A-1B, the tensile support band is arranged so that the curved end portions of the racetrack shaped tensile support band lie in a plane substantially parallel to the surface of the vessel 15 upon which it is mounted. That is, the tensile support band is positioned in a position perpendicular to the position of the tensile support band shown in FIGS. 1A, 1B.

To attach the tensile support band 22 to the mounting point 30, one need only hook the tensile support band over the mounting point and pull the tensile support band back so that the inner surface of one curved end of the tensile support band is in contact with the complementary curved surface 32 of the mounting point. Preferably, the overhanging retaining portion 34 is not present over portions 38 of the mounting point spaced further apart than the loop diameter D of the tensile support band. This is to facilitate installing of the tensile support band over the mounting point, by allowing the tensile support band 20 to be installed to the mounting point 30 without flexing the tensile support band. The absence of the overhanging retaining portion in this location has not been found to cause any difficulties. This feature facilitates installation of the tensile support band in confined spaces between vessels where access is limited. The present invention also assists in installation of tensile support bands where the mounting point is out of reach and out of sight.

Although the loop diameter D is large, compared to the conventional arrangements of FIGS. 1A-1B the low tensile support band width (5.9 mm in a certain example described below) allows use of a mounting point 30 of a very compact overall height H—in this example about 12 mm. This represents a 60% reduction in mounting point height H over the conventional tensile support band example of FIGS. 1A, 1B. By arranging the tensile support band of the invention in the orientation described with reference to FIGS. 4A-4C, a lower profile tensile support band and mounting point arrangement is provided. This allows installation in more confined spaces, for example, more closely packed concentric vessels, than the prior art arrangement of FIGS. 1A-1B.

In many applications, for example the concentric vessels used in superconducting magnet cryostats, the large loop diameter is not an issue, but the reduced height H translates directly into a reduction in the space required for the suspension system. A further advantage of the low height is a significant reduction in the bending moment applied to the surface of the vessel as a result of the suspension load, with consequent reduction in the local strength requirement of the vessel.

To allow for misalignment and vessel movements, the overhanging retaining portion 34 and the protruding lip 36 may be tapered—for example an included angle α of 6° to allow ±3° of movement. In alternative embodiment, the overhanging retaining portion 34 and the protruding lip 36 may be spaced apart by a distance greater than the width of the tensile support band 22, again to allow a similar degree of movement.

Despite the low aspect ratio W/t of the tensile support band 22 of the invention, misalignment still results in some minor increase in edge stresses in the tensile support band at points of contact with the mounting point 30. An optional refinement of the mounting point 30 to reduce this effect is the use of a compliant, low friction layer interposed between the tensile support band 22 and the curved surface 32 of the mounting point. For example, a reinforced PTFE tape may be used as the compliant, low friction layer. Alternatively, a low-modulus reinforcing layer, for example woven GRP, may be placed on the inner curved surface of the tensile support band; or different cross-section profiles may be provided at the contacting surfaces of the tensile support band 22 and the mounting point—for example "barrelling" of one or other or both of these surfaces to reduce edge stresses.

A complete summary of the dimensions of an example low aspect ratio tensile support band 22 of the present invention are provided in Table 1, for comparison with the corresponding dimensions of a typical conventional tensile support band 20 of similar strength. The tensile support bands are illustrated in FIG. 2 (conventional tensile support band 20) and FIG. 3 (low aspect ratio tensile support band 22).

TABLE 1

| Parameter | symbol | conventional tensile support band 20 | low aspect ratio tensile support band 22 |
|---|---|---|---|
| Loop diameter | D | 20.5 mm | 69 mm |
| thickness | t | 1.76 mm | 5.93 mm |
| width | W | 20 mm | 5.93 mm |
| length | L | 252 mm | 252 mm |
| diameter/thickness ratio | D/t | 11.7 | 11.6 |
| cross section area (both strands) | csa | 70.4 mm² | 70.3 mm² |
| width/thickness ratio | W/t | 11.4 | 1.0 |
| length/loop diameter ratio | L/D | 12.3 | 3.7 |
| typical mounting point height | H | 30 mm | 12 mm |

To allow a fair comparison, the key parameters of total cross section area of both strands csa and length L are held constant for both tensile support bands. In addition, to maintain strength, the parameter D/t is held approximately constant for both tensile support bands at a level typical of high performance tensile support bands (11.7 in this example). The key feature of the new design is the width/thickness ratio W/t, or aspect ratio, which is reduced from he value of 11.4 in this example to 1.0. A typical range of values for the ratio W/t is 10-20 for conventional tensile support bands.

Figure 1A:
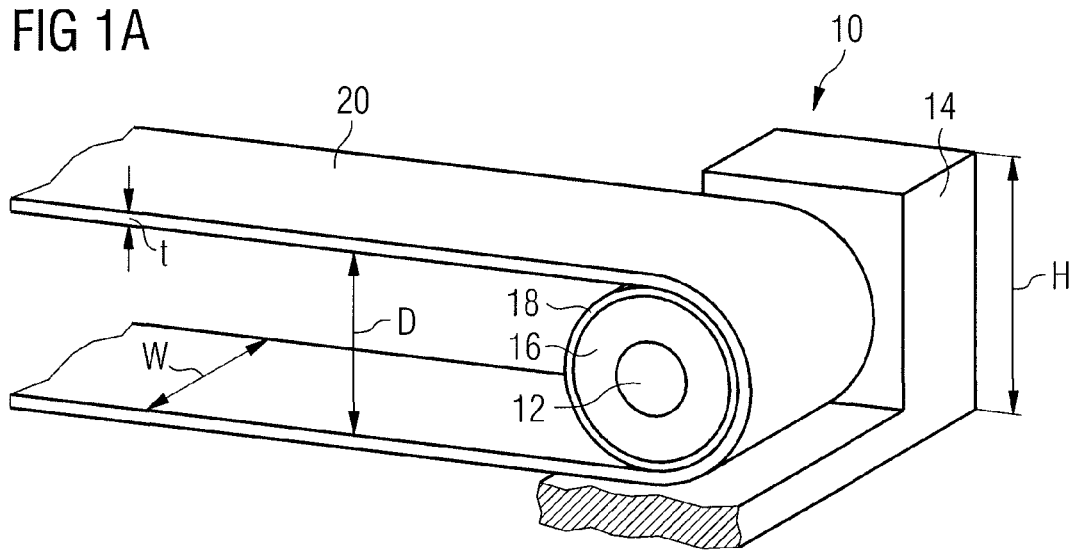
FIGS. 1A and 1B illustrate a tensile support band mounting point according to the prior art.
Figure 1B:
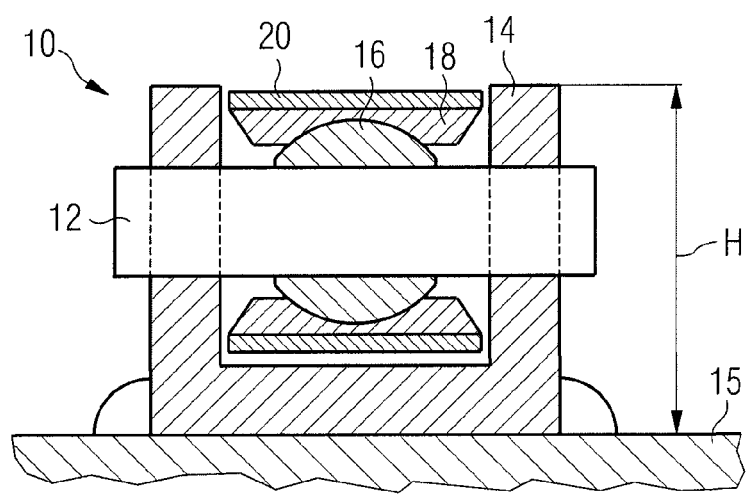

As discussed in relation to FIGS. 1A and 1B, the conventional tensile support band 20 (FIG. 2) typically uses a pin 12, with a spherical bearing 16 or other equivalent arrangement to allow for misalignment and ensure that the tensile support band 20 is subjected only to pure tensile loads. In the example shown in FIGS. 1A, 1B, the minimum height H of the termination above the surface of the suspended vessel 15 is approximately 30 mm. Alternative arrangements are possible—for example rotating the tensile support band through 90°—but may result in increased height H due to the approximately equal tensile support band width/loop diameter (in the illustrated example, W=20 mm while D=20.5 mm).

The present invention provides a tensile support band and mounting point that allows the use of a compact and simple connection system without losing the strength of the tensile support band. Compared with conventional designs the cross-section of the tensile support band has a low aspect ratio W/t, is insensitive to bending loads, and allows the elimination of the conventional bearing arrangements.

The primary advantages of the tensile support band and the mounting point arrangement of the present invention are:—
  Substantially reduced height required for location of mounting points, which is especially useful in applications where concentric vessels are supported inside each other and a separation distance between the vessels should be minimized.
  Simplified mounting points may be provided, with consequent cost advantages.
  The reduced height of the mounting points directly causes a reduced height in the point of application of the tensile strain onto the vessel, reducing stresses in the end connections and associated vessels, in turn allowing simplification of these parts.

While the present invention has been described in relation to a limited number of embodiments, given by way of examples only, various modifications and amendments may be made within the scope of the invention as defined by the appended claims.

For example, while the example tensile support band has been described as having an aspect ratio of about 1.0, the invention may be applied to other tensile support bands having a relatively low aspect ratio, typically in the range 0.5-5.0. However, a preferred range of aspect ratio W/t is 0.7-1.5. While the invention has been described in terms of mounting arrangements for cryogenic vessels, the present invention finds application in any equipment where tensile support bands are in use.

The invention claimed is:

1. A support system comprising:
   a number of racetrack-shaped tensile support bands held in tension between a supported article and a supporting article, wherein:
   each of the tensile support bands is formed as a closed loop having two substantially parallel sides that are joined by a first curved end portion and a second end portion;
   for each tensile support band, the first curved end portion is retained by a first mounting point mounted on a surface of the supported article, and the second curved end portion is retained by a second mounting point mounted on a surface of the supporting article;
   at least one of the tensile support bands is arranged so that the substantially parallel sides, the first curved end portion, and the second end portion of the closed loop define a plane that is substantially parallel to the surface of the supported article or the supporting article;
   at least one mounting point is a monolithic part that is a solidly uniform single article, and has a curved surface which is complementary to an inner curved surface of the first curved end portion or the second curved end portion of the at least one tensile support band;
   the at least one mounting point further comprises an overhanging retaining portion; and
   the at least one mounting point is formed as a hook having the overhanging retaining portion.

2. A support system according to claim 1 wherein the overhanging retaining portion is not present over portions of the at least one mounting point spaced further apart than the inner diameter of the first curved end portion or the second curved end portion of the at least one tensile support band.

3. A support system according to claim 1 wherein the at least one mounting point further comprises a protruding lower lip for preventing the at least one tensile support band from coming into direct contact with the surface upon which the at least one mounting point is mounted.

4. A support system according to claim 1, wherein the width/thickness aspect ratio of the at least one tensile support band lies in the range 0.5 to 5.0.

5. A support system according to claim 1, wherein the width/thickness aspect ratio of the at least one tensile support band lies in the range 0.7 to 1.5.

6. A support system according to claim 1, wherein the width/thickness aspect ratio of the at least one tensile support band is approximately 1.0.

7. A support system according to claim 1, wherein the at least one mounting point is directly attached to the supported article or the supporting article.

8. A support system according to claim 1, wherein a diameter/thickness ratio of the at least one tensile support band is greater than ten, and the diameter is a distance between the two substantially parallel sides of the closed loop.

9. A support system according to claim 4, wherein a diameter/thickness ratio of the at least one tensile support band is greater than ten, and the diameter is a distance between the two substantially parallel sides of the closed loop.

10. A support system according to claim 5, wherein a diameter/thickness ratio of the at least one tensile support band is greater than ten, and the diameter is a distance between the two substantially parallel sides of the closed loop.

11. A support system according to claim 6, wherein a diameter/thickness ratio of the at least one tensile support band is greater than ten, and the diameter is a distance between the two substantially parallel sides of the closed loop.

* * * * *